United States Patent [19]
Bosshart et al.

[11] Patent Number: 5,455,929
[45] Date of Patent: Oct. 3, 1995

[54] LOGIC SIMULATOR EMPLOYING HIERARCHICAL CHECKPOINTING

[75] Inventors: Patrick W. Bosshart, Plano; Daniel C. Pickens, Garland, both of Tex.

[73] Assignee: Texas Instruments Incorporated, Dallas, Tex.

[21] Appl. No.: 136,520

[22] Filed: Oct. 14, 1993

[51] Int. Cl.$^6$ .............................. G06F 12/08; G06F 11/34
[52] U.S. Cl. ..................... 395/500; 364/578; 364/DIG. 1; 395/180; 395/427
[58] Field of Search ..................................... 395/400, 425, 395/500, 550, 575; 364/578

[56] References Cited

U.S. PATENT DOCUMENTS

| | | | |
|---|---|---|---|
| 4,862,347 | 8/1989 | Rudy | 395/500 |
| 4,924,429 | 5/1990 | Kurashita et al. | 364/578 |
| 5,008,786 | 4/1991 | Thatte | 395/425 |
| 5,142,488 | 8/1992 | Chan et al. | 364/728.06 |

*Primary Examiner*—Ken S. Kim
*Attorney, Agent, or Firm*—John D. Crane; Richard L. Donaldson

[57] ABSTRACT

A simulator system of a digital network which may contain a memory. The system includes at least three hierarchical data storage buffers 18, 20, 24, 26 for storing the simulated network signals for simulated registers and combinatorial logic at the close of each simulation cycle. Each buffer 20, 24, 26 has a plurality of entries comprising a periodic sampling, sometimes referred to as checkpointing, of the next lower storage buffer. The system also includes a change management list 30 and a memory data array 32 for respectively storing time/address pairs and time/value pairs to identify the time, address and value of memory writes. These pairs of data are updated (i.e., checkpointed) each time a selected data storage buffer 24, 26 starts to have previously written locations overwritten by newer data.

17 Claims, 4 Drawing Sheets

| Time Period | Change Management List Content | |
|---|---|---|
| 0<T<=10K | $T_1,A_2$ , $T_2, A_1$ .... | Time/Address pairs for each memory location written during the time period |

Fig. 2

| Time Period | Change Management List Content | |
|---|---|---|
| 0<T<=10K | $T_1,A_2$ , $T_2, A_1$ .... | Time/Address pairs for each memory |
| 10K<T<=20K | $T_{31},A_2$ , $T_{41}, A_1$ .... | location written during the time period |

Fig. 3

| Time Period | Change Management List Content | |
|---|---|---|
| 0<T<=10K | $T_3,A_2$ , $T_4, A_1$ .... | Most recent Time/Address pair per memory location per 10K interval |
| 10K<T<=20K | $T_{31},A_2$ , $T_{41}, A_1$ .... | |
| 20K<T<=30K | $T_{51},A_2$ , $T_{61}, A_1$ .... | Time/Address pairs for each memory |
| 30K<T<=40K | $T_{71},A_2$ , $T_{81}, A_1$ .... | location written during the time period |
| 40K<T<=50K | $T_{91},A_2$ , $T_{101}, A_1$ .... | |
| 50K<T<=60K | $T_{111},A_2$ , $T_{121}, A_1$ .... | |

Fig. 4

| Time Period | Change Management List Content | |
|---|---|---|
| $0 < T \leq 10K$ | $T_3, A_2$ , $T_4, A_1$ .... | Most recent Time/Address pair per memory location per 10K interval |
| $10K < T \leq 20K$ | $T_{35}, A_2$ , $T_{47}, A_1$ .... | |
| $20K < T \leq 30K$ | $T_{51}, A_2$ , $T_{61}, A_1$ .... | |
| $30K < T \leq 40K$ | $T_{71}, A_2$ , $T_{81}, A_1$ .... | |
| $40K < T \leq 50K$ | $T_{91}, A_2$ , $T_{101}, A_1$ .... | Time/Address pairs for each memory location written during the time period |
| $50K < T \leq 60K$ | $T_{111}, A_2$ , $T_{121}, A_1$ .... | |
| $60K < T \leq 70K$ | $T_{131}, A_2$ , $T_{141}, A_1$ .... | |

Fig. 5

| Time Period | Change Management List Content | |
|---|---|---|
| $0 < T \leq 1M$ | $T_{100}, A_2$ , $T_{250}, A_1$ .... | Most recent Time/Address pair per memory location per 1M interval |
| $1M < T \leq 1M+10K$ | $T_{1000}, A_2$ , $T_{1001}, A_1$ .... | |
| $1M+10K < T \leq 1M+20K$ | $T_{1002}, A_2$ , $T_{1003}, A_1$ .... | |
| $1M+20K < T \leq 1M+30K$ | $T_{1004}, A_2$ , $T_{1005}, A_1$ .... | Time/Address pairs for each memory location written during the time period |
| $1M+30K < T \leq 1M+40K$ | $T_{1006}, A_2$ , $T_{1007}, A_1$ .... | |
| $1M+40K < T \leq 1M+50K$ | $T_{1008}, A_2$ , $T_{1009}, A_1$ .... | |

Fig. 6

| Address | Memory Data Array Content | |
|---|---|---|
| $A_1$ | $T_2, V_2$ , $T_4, V_4$ .... | Time/Value pairs for each memory |
| $A_2$ | $T_1, V_1$ , $T_3, V_3$ .... | location written |
| . | . | |
| . | . | |
| . | . | |

Fig. 7

| Address | Memory Data Array Content | |
|---|---|---|
| $A_1$ | $T_4, V_4$ , $T_{41}, V_{41}$ .... | Time/Value pairs for each memory |
| $A_2$ | $T_3, V_3$ , $T_{31}, V_{31}$ .... | location written |
| . | . | |
| . | . | |
| . | . | |

Fig. 8

| Address | Memory Data Array Content | |
|---|---|---|
| $A_1$ | $T_{250}, V_{250}$ , $T_{1001}, V_{1001}$ .... | Time/Value pairs for each memory |
| $A_2$ | $T_{100}, V_{100}$ , $T_{1000}, V_{1000}$ .... | location written |
| . | . | |
| . | . | |
| . | . | |

Fig. 9

LOGIC SIMULATOR EMPLOYING HIERARCHICAL CHECKPOINTING

RELATED APPLICATION

This patent application is related to U.S. patent application Ser. No. 08/112,906 filed Aug. 26, 1993, which is a continuation of U.S. patent application Ser. No. 530,716 filed May 29, 1990, now abandoned.

FIELD OF THE INVENTION

This invention relates to the field of logic simulators and more specifically to logic simulators for performing very long simulations of logic circuits which may include digital memories.

BACKGROUND OF THE INVENTION

Logic simulators have been used for many years by designers to test the integrity of their logic designs without requiring building and testing of the actual logic design. The logic simulator simulates the functions performed by the specific design and provides the design engineer with an opportunity to examine the signals generated by the design. From an analysis of the simulated signals, the designer may uncover design flaws.

When a design error is identified, the logic simulator permits the designer to easily modify the design and rerun the logic simulation. The ability to change a design and quickly test the changed design has significantly reduced the overall circuit design time. As a result of these advantages of simulators, designers have come to rely on simulators to uncover errors in their designs and to quickly test the new design for errors.

The above described design approach using simulators is most suitable for relatively simple logic simulations. When one attempts to simulate very complex logic networks, however, the simulator running time may last for many hours and in the more complex logic networks, the simulation may take many days to complete. This is due primarily to the greater number of circuits being simulated. During such simulations, some of the simulation data is dumped to an output trace file. In the event an error is found in the logic design being simulated, typical simulators must rely on the data in the trace file. Since the amount of data available in typical trace files is limited, multiple simulations may be needed in order to completely test a logic design.

In searching for a solution to the above mentioned problems, a checkpoint scheme has been developed which allows the designer to rerun a simulation at a desired checkpoint thereby making it easier to observe simulated signals at different times. This technique involves periodically storing the data signal values for the logic network and discarding some of the data signals created at simulation cycles other than those that are saved. Checkpointing allows the designer to rerun a simulation starting at many but not all previously simulated machine cycles. If the exact machine cycle is not checkpointed and, is not available, then the simulator selects the nearest earlier checkpoint and reruns the simulation starting there. The simulation will arrive at the desired machine cycle after a short delay. However, this approach, like others that have been tried, requires a very large number storage locations in order to provide checkpointing. Hence, the length of simulations that can be effectively evaluated and rerun using checkpoint data is limited by the amount of checkpoint memory available to the simulator.

The problem of availability of memory for storing data signals becomes much more acute when the network being simulated includes one or more memories. In existing simulators, each memory location in the network written to during the course of a simulation requires a comparable amount of memory for storing simulated data. As the size and number of the memories increase, the size of the logic network connected thereto becomes larger and as the simulation time becomes longer, the memory requirements of the simulator become increasingly larger and ultimately memory size limitations of the simulator prevent the simulator from performing uninterrupted simulations of a desired length.

BRIEF DESCRIPTION

The present invention comprises a logic simulator which utilizes hierarchical checkpointing and is particularly useful for long simulations of complex logic networks including one or more memories. The simulator has a memory data array for each memory in the logic network being simulated. Each memory data array is for storing the time and the content or value (time/value pair) of each simulated write to a simulated memory. The simulator also includes a change management list for each memory in the logic network being simulated which provides a pointer (time/address pair) to memory locations where the time/value pair is located.

The simulator includes a hierarchical structure of checkpoint data registers for storing simulated data signals for the digital logic in the network being simulated. The hierarchical structure includes a first register has a plurality of locations each of which stores a plurality of simulated circuit signals for each simulated cycle stored therein. A plurality of such simulated circuit signals comprise all the stored signals in a given first time interval or group. The first register is large enough to store the simulation data signals for a plurality of first time intervals. The hierarchical structure includes a second register coupled to the first register, the second register including a plurality of locations. The second register receives all the stored simulated signals for one cycle in each first time interval, the signals stored in said second register being grouped into a second time interval larger than said first time interval. Data is transmitted from said first to said second register when the data in a previously written group in the first register is about to be overwritten with new data.

Additional hierarchical registers are provided, each coupled to an earlier register for storing, in one of a plurality of locations therein, the simulated signals for one cycle in each time interval identified in the earlier register. A data transfer from one register to the next higher hierarchical register occurs each time data in the lower of the two hierarchical registers is about to be overwritten by new data.

The simulator also includes a hierarchical checkpoint updating system which periodically checks the status of the memory data array and change management list and removes data therefrom for times not corresponding to the most recent data stored into each simulated memory location during each sampling interval correlated to a given data transfer from one selected hierarchical register to another.

BRIEF DESCRIPTION OF THE DRAWINGS

The foregoing and other advantages and features of the present invention are described below in connection with the drawings wherein:

FIGS. 2–6 illustrate the content of the change management list at different times during a typical simulation of a logic network; and FIGS. 7–9 illustrate the content of the memory data array at different times during a typical simulation of a logic network.

DETAILED DESCRIPTION

Figure 1:
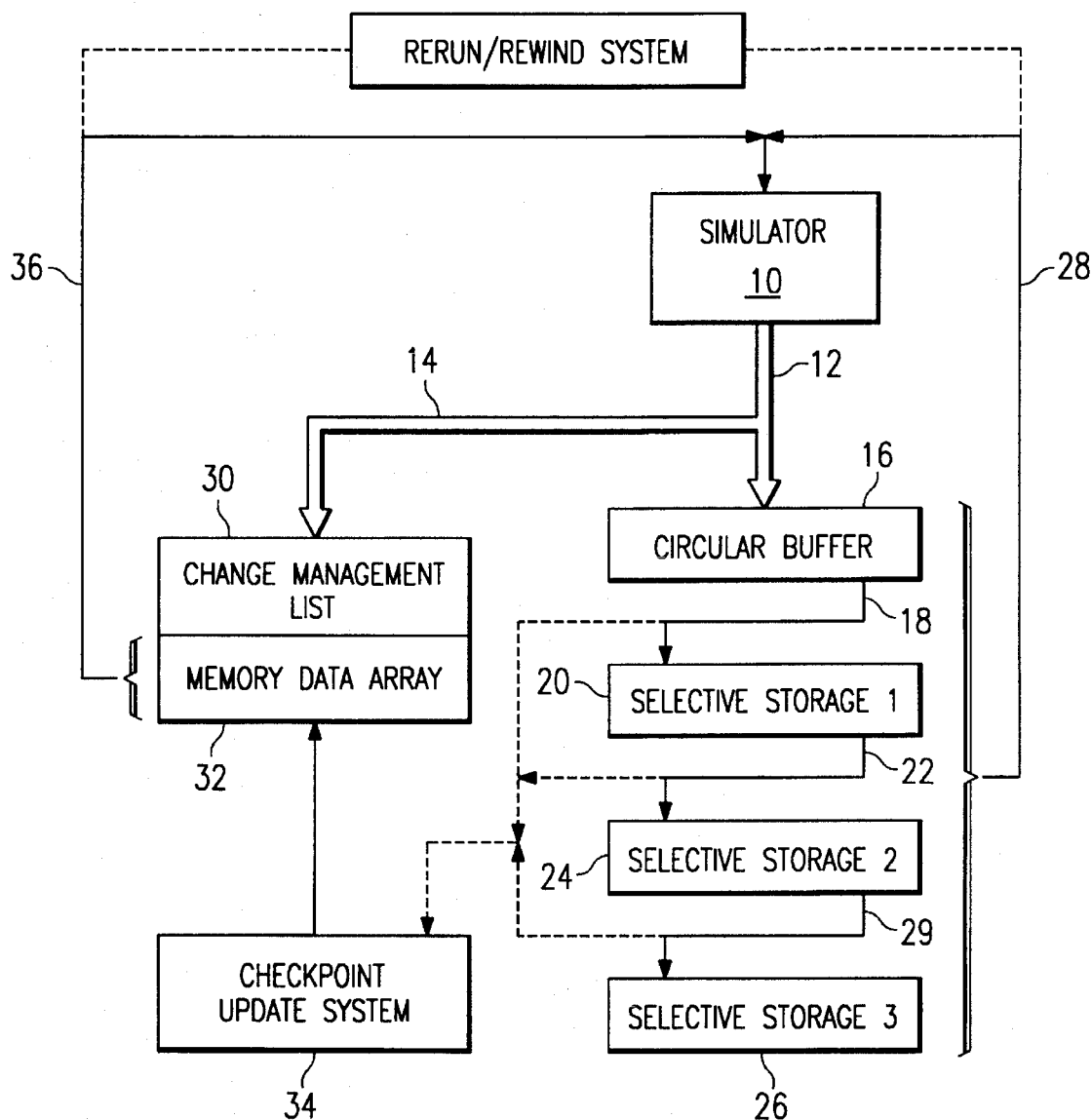
FIG. 1 is a block diagram of a system including the present invention.

Referring first to FIG. 1, a simulator 10 for simulating a logic network is provided. The simulator 10 is of the type well known in the art and may comprise either a hardware or a software based system. The simulator 10, however, operates on a description of the logic network being simulated and produces, at its output 12, data signals which are representative of the signal level at a plurality of locations within the simulated logic network at the close of each simulated cycle. For complex logic networks under simulation, the number of signals appearing at the output 12 may number in the thousands or tens of thousands or more. In situations where the simulator is simulating a logic network which includes digital memories, the output of the simulator 10 may additionally include output signals on the line 14 which comprise information identifying the time, value and memory location which is changed.

The network of FIG. 1 includes a circular buffer 16 which couples to the output 12 of the simulator 10 for receiving the values for the plurality of circuit signals being simulated. The simulated signals typically includes signals representing the output of combinatorial logic as well as the state of registers. These values for circuit signals are stored in the circular buffer 16 which contains a plurality of locations for storing the simulator output for a plurality of circuits in the network being simulated at the end of the latest simulation cycle. In addition, the buffer 16 has a plurality of storage locations for storing the simulator output at the end of a plurality of earlier simulator cycles. Indeed, in the preferred implementation of this invention, the buffer 16 has 200 buffer locations, each for storing the value for circuit signals at the end of a single simulated cycle. In addition, the buffer 16 is organized so that the values for the circuit signals for two time intervals of 100 machine cycles each can be stored therein.

The circular buffer 16 includes, as already mentioned, a plurality of locations for storing digital signals appearing at the output of the simulator 10. The number of contiguous simulator cycles which can be stored within the buffer 16 is limited to an arbitrary number of cycles which, in the preferred embodiment of the present invention, comprises about two hundred cycles although an arbitrary number of locations either greater than or less than this number can be utilized. While the number of simulated cycles that are stored in the buffer 16 is arbitrary, an important factor in determining the exact size is the desirability to the user to be able to rerun the simulation at an exact simulated cycle in the past. The more storage locations that are available for the buffer 16, the larger the number of exact prior simulated network states are available to the user for the purpose of rerunning the simulation. This aspect of the invention will become clearer later.

Since a hierarchical structure has been established for storing the digital signals from the simulator, the circular buffer 16 has a cache line 18 which selectively transfers data. This data represents the state of the circuits being simulated at the end of a selected simulation cycle which is transferred from the circular buffer 16 to a first selective storage buffer 20. One such transfer from buffer 16 to the first selective storage buffer 20 occurs for each interval of data stored in the buffer 16. In the illustrated embodiment, this means that the simulation data for one cycle in every 100 cycles stored in buffer 18 is transferred to buffer 20. It is preferable that the selected periodic interval is at least no longer than half the total number of cycles required to completely fill the circular buffer 16 prior to overwriting previously filled locations and, in the preferred embodiment, the cache line 18 is activated once every 100 simulated cycles.

The first selective storage buffer 20 has a plurality of locations which also is an arbitrary in number although this is preferably as large as or larger than the number of storage locations within the buffer 16. For example, the first selective storage buffer 20 might include 500 locations each having data stored therein representative of one machine cycle output of the simulator 10 occurring at a time different from its immediately adjacent locations by the number of cycles separating adjacent data transfers on the line 18. If the buffer 16 transfers data to the first selective storage buffer 20 every 100 simulation cycles, for example, the first selective storage buffer 20 will have a plurality of data signal outputs from the simulator 10 each stored therein a first time interval or 100 simulation cycles from the preceding simulator outputs.

The data in the buffer 20 is preferably arranged in 5 time intervals of 100 entries each (i.e. there are 5 groups of checkpoints each group containing 100 checkpoints), Since each entry (checkpoint) in buffer 20 occurs every 100 simulation cycles, each time interval of data (group of checkpoints) in buffer 20 represents the circuit signals output from the simulator every 100 simulation cycles for a second time interval of a total of 10,000 simulation cycles. As the buffer 20 has 500 locations in the preferred embodiment of the invention, the simulated circuit signals every 100 cycles for the most recent 50,000 simulation cycles are stored therein. It should be noted as well that the specific signals stored in the buffer 20 will always include the simulated signals for all registers in the circuit network being simulated and may in addition include the data signals representative of combinatorial logic in the network being simulated. The buffer 16, on the other hand, includes simulation signals for all registers and combinatorial logic in the network being simulated. As such, each buffer position of buffer 20 needs to be no larger than each position in buffer 16 and may be considerably smaller if the combinatorial logic signals of the network being simulated are not stored therein.

The first selective storage buffer 20 also has a cache line 22 which, when this line is activated, causes data to be transmitted from the first selective storage buffer 20 to a second selective storage buffer 24. Assuming that the number of locations in the buffer 20 is 500, the buffer 20 becomes completely full after 50,000 simulator cycles have elapsed. Thereafter, as data is entered into buffer 20, previously entered data in one group is invalidated and subsequently overwritten. The group chosen for invalidation is the least recently used (LRU) group. Therefore, when data in the LRU group stored in buffer 20 is about to be overwritten with new data in a new group, the data for one cycle in the LRU group of checkpoint data in buffer 20 is transferred to buffer 24 over cache line 22. The frequency of transfers on line 22 is selected to be one transfer for every 100 entries in the first selective storage buffer 20, since there are 100 entries in each checkpoint group of buffer 20. This means that one transfer will occur over line 22 every interval of 10,000 simulation cycles after the first 50,000 simulation cycles have elapsed.

While it is preferred that the next hierarchical register of the present invention does not have data transferred thereto until the previous hierarchical register is about to have data therein overwritten, those of skill in the art will recognize that this need not be the case. It is possible to transfer data for a selected cycle in a group of checkpoint data from a lower to the next higher checkpoint hierarchical register at any time after the desired cycle in the group has been entered into the lower hierarchical register but prior to the time that the desired cycle data is overwritten.

The second selective storage buffer 24 preferably has 500 storage locations therein for storing the data associated with 500 checkpoints. Every 100 locations in buffer 24 comprise a group of checkpoints occurring over a third interval of time comprising 1,000,000 simulation cycles, each location storing the simulator data signals for a simulator cycle which is separated by 10,000 simulation cycles from the adjacent simulation cycle stored therein. Once the buffer 24 is filled completely after the first 5,000,000 simulator cycles, a group of checkpoints previously written must be made invalid so the data can be overwritten with new checkpoint data.

The system in FIG. 1 includes a third selective storage buffer 26 which is coupled by a cache line 29 to the second selective storage buffer 24. The third selective storage buffer 26 has as many cycle storage locations as is desired. Since a transfer on line 29 will preferably occur at least once every 1 million cycles of the simulator once buffer 24 becomes completely filled, the buffer 26 will have a size which corresponds to the number of million simulation cycles the user has run.

In summary, the circular buffer 16 has 200 of the most recent data signal outputs from the simulator 10. The first selective storage buffer 20, however, has 500 simulated signal outputs stored therein each separated by a maximum of 100 simulator machine cycles. This data is organized into five groups of 100 simulated signal outputs. The second selective storage 24 has an additional 500 storage locations. This data is organized into five groups of 100 simulated signal outputs, each separated by 10,000 cycles. The third selective storage 26 also includes a plurality of locations which may be as many as desired, however, each adjacent set of signals stored therein are separated by 1 million machine cycles of the simulator 10.

The system of FIG. 1 includes a rerun/rewind system 38 for receiving data from an operator defining a previously executed simulation cycle at which the operator wishes to rerun or rewind the simulation. The term rerun implies that the simulation is restarted at a previously executed simulation cycle and the stored data for logic signals and memory locations previously simulated is not changed. This allows recreation of simulation data at a desired past simulation cycle so as to observe the behavior of the network being simulated at that and later times. The term rewind implies that logic signals and memory data for previously executed simulation cycles occurring after a given simulation cycle are forgotten i.e., cleared from the various storage buffers. Thereafter, the simulator is started with the remaining data in the storage buffers serving as the initial values for the simulation.

Buffers 16, 20, 24, and 26 are coupled to the rerun/rewind system 38. When a simulation rerun is desired, the rerun/rewind system 38 scans the data in buffers 16, 20,24 and 26, in that order, to determine the first buffer to have simulation data therein for the desired restart cycle or, when an exact match is not found, to determine the first buffer having the closest but earlier cycle than the desired restart cycle. Once the data is located for the desired cycle or the next closest but earlier checkpointed cycle, that data is copied progressively to the next lower level buffer until it is placed in the circular buffer 16. In this process, some of the checkpoint data in each buffer is lost due to the data from a higher buffer being transferred to a lower buffer. In addition, other data may be lost in the group of data into which the checkpoint data for rerunning the simulation is being inserted. After the buffers have been updated, the desired rerun data in the buffer 16 is then coupled over line 28 to the simulator 10 to cause the simulation to begin the rerun with the desired data in the simulator registers.

As already noted, the simulator 10 may be simulating a logic network which includes a memory. In order to rerun/rewind such a simulator, it is imperative that the memory data be recorded whenever a memory location is written to. This is accomplished by having the information relating to the time a change to memory data occurs, the location at which a change occurs and data stored within the changed memory location. This information is transmitted over the line 14 to a change management list 30 and a memory data array 32 each time a simulated network memory location is changed. The change management list 30 is utilized to identify the time and the location in the memory which has changed. The memory data array 32, on the other hand, is utilized to indicate the time and the data content which is stored into each changed memory location in the simulated network. In addition, the memory data array 32 serves as the simulated memory locations.

As noted above, the change management list 30 and the memory data array 32 have stored therein data which relates to the time and content of any memory location change during the course of the simulation. When the simulated system stores data D to a simulated memory at address A at time T, the memory data array 32 stores at address A, time and data information consisting of T and D. At the same time, the change management list 30 stores corresponding time and address information consisting of T and A.

Since some digital networks which are simulated may include a large number of memory writes, the size of the list 30 and array 32 must be sufficient to hold all these changes or some checkpoint mechanism must be provided. The present invention contemplates use of a checkpoint system 34 which periodically checks the change management list 30 and a memory data array 32 and selectively removes entries. The checkpoint system 34 is coupled to the buffers 16, 20, 24, and 26 allowing the change management list 30 and memory data array 32 to be checkpointed in synchrony with checkpointing in the buffers 16, 20, 24, and 26. It should also be noted that the list 30 and array 32 do not have to be checkpointed in synchrony with changes in buffer 16 or 20 as memory writing is, for many simulations, quite infrequent so that the data storage requirements are not large enough to require checkpointing as frequently as buffers 16 and 20 are checkpointed. It is necessary to update the list 30 and the array 32 in synchronism with updating of buffers 24 or 26.

The list 30 and the array 32 are coupled to the simulator 10. The array 32 serves two functions. It serves as the memory for the simulated circuits and places that data onto the line 36 when called for by the simulator 10. It also serves to store historical information relating to when a memory location is written to and the data stored at that time. When a simulator restart or rewind is requested by the restart/rewind system 38, data is sent to the list 30 and the array 32 indicating the time of the cycle at which the simulation is to be restarted. In the case of a simulation restart, the data stored in the list 30 and the array 32 is not in any way changed. In the case of a simulation rewind, however, all data corresponding to memory writes for the circuit being simulated, which occur after the time at which the simulation is "rewound" to, is cleared.

In order to more completely understand the operation of the checkpoint updating system 34 in cooperation with the change management list and the memory data array, reference will now be made to FIGS. 2–9. In FIG. 2, the content of the change management list 32 is illustrated during the first 10 thousand cycles of the network being simulated. As noted above, the change management list contains a plurality of entries each of which identifies the time and the address where data was stored in the memory of the network being simulated. In FIG. 2, two of a plurality of time/address pairs are specifically shown, namely, $T_1,A_2$ and $T_2, A_1$. The first such entry corresponds to the fact that at time $T_1$, the content at address $A_2$ was changed. The second such entry corresponds to the fact that at time $T_2$, the content at address $A_1$ was changed. The additional dots after these two specific entries indicate that there are many additional entries to the change management list corresponding to writing data to other or the same memory locations in the simulated network.

Referring now to FIG. 3, the content of the change management list 30 is illustrated for the time period or interval $10K<T<=20K$. During this time period, a plurality of writes occur with two specific instances being illustrated, namely, $T_{31}, A_2$ and $T_{41}, A_1$. The dots after these two entries indicate that additional entries have been saved but they have not been specifically illustrated.

FIG. 4 illustrates the content of the change management list 30 at a point in time where between 50 and 60 thousand cycles have been simulated. The time/address pairs are indicated for the time period when the change occurred. As the first selective storage buffer 20 contains 500 locations spaced at intervals of 100 cycles, when the simulator completes 50 thousand cycles, data contained therein must be overwritten in order to make room for new network data points representative of the state of the network under simulation. As this is the case and since the last state of the simulated network is saved in the second selective storage buffer 24, there is no need to retain all the changes to the memory during the first 10 thousand cycles of the simulation but only a need to retain the last change to each memory location changed during the first 10 thousand simulation cycles. The checkpointing system 34, accordingly, causes the data representing memory writes during the first 10,000 simulation cycles to be pruned down to only the last write to each address written during the first 10 thousand simulation cycles. As such, the first line of FIG. 4 illustrates two time/address pairs which represent the most recent time data was stored into memory location $A_2$ and $A_1$. which respectively occurred at time $T_3$ and $T_4$. The remainder of the entries in FIG. 4 correspond to the time/address pairs for the memory locations written during the indicated time periods.

FIG. 5 illustrates a time when at least 60 thousand simulation cycles have elapsed and data is being stored for the simulation cycles between 60 thousand and 70 thousand. As the data in the first selective storage buffer 20 for the simulation cycles between 10 and 20 thousand must be overwritten, the checkpointing system 34 causes the data in the change management list 30 to be pruned by retaining only the latest time/address pair for each address changed in the time period between 10 and 20 thousand simulation cycles and eliminating all other time/address pairs for that addresses changed during this time period. This is illustrated in FIG. 5 by the fact that the most recent write to memory location $A_1$ occurred at time $T_{47}$ and the most recent write to memory location $A_2$ occurred at time $T_{35}$.

FIG. 6 illustrates a time when at least 5 million simulation cycles have elapsed and data is being stored for the simulation cycles between 5 and 6 million. As the data in the second selective storage buffer 24 for simulation cycles between 0 and 1 million must be overwritten, the checkpointing system 34 causes the data in the change management list 30 to be pruned again by retaining only the latest time/address pair for simulated memory addresses which were changed in the time period between 0 and 1 million simulation cycles and eliminating all other time/address pairs for addresses changed during this time period. This is illustrated in FIG. 6 by the fact that the most recent write to memory location $A_1$ occurred at time $T_{250}$ and the most recent write to memory location $A_2$ occurred at time $T_{100}$.

FIG. 7 illustrates the content of the memory data array 32 at a time when the change management list 30 has contents such as is illustrated in FIG. 3. The memory data array 32, as mentioned earlier, contains, for each address in the simulated network, a series of time/value pairs. Each time/value pair indicates the time in the simulation and the value to which the particular memory location is changed. Specifically, address $A_1$ has been changed at time $T_2$ to value $V_2$ and has also been changed at time $T_4$ to value $V_4$. Address $A_2$ has been changed at time $T_1$ to value $V_1$ and has also been changed at time $T_3$ to value $V_3$. The dots following these entries signify that other changes of the data in these memory locations have occurred at earlier times than specifically noted. The dots extending downwardly indicate that changes have occurred at other memory locations and times.

FIG. 8 illustrates the content of the memory data array 32 at a time when the change management list 30 has contents such as is illustrated in FIG. 4. In particular, the checkpoint updating system 34 causes the data in the memory data array 32 to be updated once the data in the first selective storage buffer 20 begins to be overwritten. For example, the time/value pairs for memory location $A_1$ have to be updated to include the fact that the time value pair $T_4,V_4$ is the most recent time/value pair for location $A_1$. All earlier time value pairs for the time interval $0<T<=10K$ at address $A_1$ are removed from the memory data array 32 by the checkpoint updating system 34. The time/value pairs for all other memory locations are updated as well. For example, memory location $A_2$ is also updated to include the fact that the time value pair $T3,V_3$ is the most recent time/value pair for location $A_2$ for the time interval $0<T<=10K$.

The checkpoint updating system 34 will continue to update the memory data array 32 and the change management list 32 in a manner such as described above until the second selective storage 24 is filled and must be rewritten which occurs after 5 million simulation cycles. At this time, the memory data array 32 needs to be updated in a somewhat different way to reflect the fact that not all the checkpoint data is being retained in the second selective storage buffer 24. Since only the state of the network being simulated at simulation cycle 1 million is retained in the third selective storage buffer 26, the memory data array 32 needs to retain only the time/value pair for the most recent write to each location in the simulated memory. This fact is illustrated in FIG. 9 by showing that address $A_1$ was most recently written during the first million simulation cycles at time $T_{250}$ to a value $V_{250}$ and that address $A_2$ was most recently written at time $T_{100}$ to a value $V_{100}$. All time/value pairs occurring in the first 1 million simulation cycles other than the last for each address changed in this time period are removed from the memory data array 32. Additional time/value pairs corresponding to memory writes occurring during other time intervals are retained in the memory data array 32 as illustrated by the fact that address $A_1$ was written at time $T_{1001}$ to a value $V_{1001}$ and that address $A_2$ was written at time $T_{1000}$ to a value $V_{1000}$. Further pruning of the memory data array 32 of this type will occur each time an additional 1 million machine cycles have been simulated.

While the above description has been made with particular emphasis on the embodiment illustrated in the figures, those of skill in the art will readily recognize that the specifics of the embodiment disclosed may be changed in many ways without departing from the spirit and scope of the present invention as defined by the following claims.

What is claimed is:

1. A memory system for storing logic checkpoint data for use in restarting a logic simulator at a previously executed logic state, the memory system comprising, in combination:

a circular buffer having p positions therein where P is an integer greater than one, each buffer position for storing an identification time and associated simulation signal values for the logic network being simulated, each said identification time and associated simulation signal values stored in said circular buffer having been generated at the close of each of the P most recently executed simulated time periods;

first selective storage means coupled to said circular buffer for storing the Qth identification time and the associated simulation signal values stored in said circular buffer every N simulation time periods where Q and N are integers less than or equal to P, said first selective storage means storing M identification time and the simulation signal values associated therewith where M is an integer greater than one;

a plurality of additional selective storage means one of which is coupled to periodically receive data from said first selective storage means and all other said plurality of additional selective storage means being coupled to periodically receive data from another said additional selective storage means, each said additional selective storage means for storing a plurality of identification times and associated signal values, each said additional selective storage means periodically receiving from the selective storage means coupled thereto at least one identification time and associated signal values during each time interval equal to the time required to completely fill the selective storage means from which data is received; and, means responsive to said buffer and said storage means for coupling the associated signal values to an external simulator for a selected one of said identification times stored in said buffer or said storage means thereby permitting restarting the simulator at the state defined by the signal values at the selected identification time.

2. The memory system of claim 1 wherein said circular buffer retains about 200 simulated time periods of data.

3. The memory system of claim 1 wherein said first selective storage means receives an identification time and associated simulation signal values about every 100 simulated time periods.

4. The memory system of claim 1 wherein said additional selective storage means coupled to said first selective storage means receives an identification time and associated simulated signal values from said first selective storage means about every 10,000 simulated time periods.

5. A memory system for storing checkpoint data used in restarting logic simulator of a digital network wherein the simulated digital network includes a memory to be simulated, the memory system comprising, in combination:

a change management list memory for storing time/address pairs of information identifying each time and the address to which data was stored in the memory to be simulated during the course of any simulation of the digital network;

a memory data array for storing time/value pairs of information identifying each time and the value which was stored by the simulator in a given simulated memory location during the course of any simulation of the digital network;

first updating means operative after a plurality of first sampling intervals have elapsed to periodically remove all but a first selected time/address pair from said change management list and the associated time/value pair from said memory data array for each simulated memory location written to during a selected prior first sampling interval;

second updating means operative after a plurality of second sampling intervals have elapsed to periodically remove all but a second selected time/address pair from said memory management list and the associated time/value pair from said memory data array for each simulated memory location written to during a selected prior second sampling interval; and, restart means responsive to said change management list and said memory data array for restoring all the data in said simulated memory from said memory data array to the value existing at the time just prior to the simulation cycle at which the simulator is desired to be restarted.

6. The memory system for use in a digital network simulator of claim 5 wherein said first selected time/address pair and the associated time value pair comprise the most recently written time/address pair and associated time value pair for each memory location written to during said first sampling interval; and said second selected time/address pair and the associated time value pair comprise the most recently written time/address pair and associated time value pair for each memory location written to during said second sampling interval.

7. The memory system for use in a digital network simulator of claim 6 wherein said first sampling interval is about 10,000 cycles in duration.

8. The memory system for use in a digital network simulator of claim 6 wherein said second sampling interval is about 1,000,000 cycles in duration.

9. A memory system for use in a logic simulator system for simulating the operation of a digital network which includes memory and which may be restarted at one of a plurality of selected times comprising, in combination:

a circular buffer for storing M identification times and the associated simulation signal values, for data signal leads of the digital network being simulated, which are generated at the close of each of the M most recently executed simulated time periods where M is an integer greater than one;

first selective storage means coupled to said circular buffer for storing an identification time and the associated simulation signal values stored in said buffer every N simulation time periods where N is an integer greater than one and less than M, said first selective storage means storing a maximum of P identification time and associated simulation signal values where P is an integer greater than one;

a plurality of additional selective storage means one of which is coupled to periodically receive data from said first selective storage means and all other said additional selective storage means being coupled to periodically receive data from another said additional storage means, each said additional selective storage means for storing a plurality of identification times and associated signal values, each said additional selective storage means periodically receiving from the selective storage means coupled thereto at least one identification time and associated signal values during each time interval equal to the time required to completely fill the selective storage means from which data is received;

for each memory in the simulated digital network, a change management list memory for storing time/address pairs of information identifying each time and the address to which data was stored in the simulated memory during the course of any simulation of the digital network;

for each memory in the simulated digital network, a memory data array for storing time/value pairs of information identifying each time and the value which was stored by the simulator in a given simulated memory location during the course of any simulation of the digital network; and restart means operative to derive, from said change management list and said memory data arrays the data at each simulated memory location existing at a simulator restart time, said restart means being additionally operative to apply the signal values for said simulator restart time in one said selective storage means to the simulated digital network, said simulator restart time corresponding to the identification time stored in one said selective storage means at least equal to or earlier than a user selected simulator restart time.

10. The memory system for use in a digital network simulator of claim 9 additionally including means to periodically update the data in the change management list and the memory data array, each time any said additional selective storage means is updated, to remove all but the most recent time/address pair and time/value pair for each memory address written by the simulator during the oldest preceding sample interval stored in the preceding selective storage means.

11. The memory system for use in a digital network simulator of claim 9 additionally including means to periodically update the data in the change management list and the memory data array every P simulation cycles to remove all but the most recent time/address pair and time/value pair for each memory address written by the simulator during a preceding P simulation cycle period; and means to periodically update the data in the change management list and the memory data array every Q simulation cycles, where Q is an integral multiple of P, to remove all but the most recent time/address pair and time/value pair for each memory address written by the simulator during a preceding Q simulation cycle period.

12. The memory system for use in a digital network simulator of claim 11 wherein Q is about 1,000,000.

13. The memory system for use in a digital network simulator of claim 11 wherein P is about 10,000.

14. A method for checkpointing data from a digital logic network simulator to permit later restarting of the simulator at a selected time, the method comprising the steps of:

a.) sampling data signals representative of the state of a simulated logic network at the close of each simulated cycle;

b.) storing at the close of each simulated cycle said sampled data signals in a circular buffer containing M locations, each location of which contains said sampled data signals for a different simulation cycle, where M is an integer greater than one wherein said circular buffer contains the sampled data signals for the M most recently executed simulation cycles;

c.) transferring every N simulation cycles said sampled data signals for one position in said circular buffer to a first selective storage buffer where N is an integer less than or equal to M, said first selective storage buffer containing a finite number of locations arranged in Q groups of R locations in each group where Q and R are integers greater than one;

d.) transferring every N×R simulation cycles said sampled data signals for a selected simulation cycle in the Qth group of simulation cycles stored in said first selective storage buffer to a second selective storage buffer, said second selective storage buffer containing a finite number of locations arranged in S groups of T locations in each group, where S and T are integers greater than one;

e.) transferring said sampled data signals for one simulation cycle from the Sth group of simulation cycles in said second selective storage buffer to a third selective storage buffer every N×R×T simulation cycles, said third selective storage buffer containing a finite number of locations; and, f.) transferring to the simulator said sampled data signals from said circular buffer or said selective storage buffers corresponding to the data state of the network being simulated at a selected previously simulated time to permit restarting the simulation at said previously simulated time.

15. The method of claim 14 additionally including the steps of:

f.) recording, for each memory in the simulated network in a change management list associated with the changed memory, the time and address at which data is stored by the simulated network;

g.) recording, for each memory in the simulated network in a memory data array associated with the changed memory, the time and value to which the location identified in step f is changed.

16. The method of claim 15 additionally including the steps of:

h.) updating, each time sampled data signals in said first selective storage buffer are transferred to said second selective storage buffer, each memory data array to retain a selected time and data information for each memory location changed during the time range encompassed by said Qth group; and i.) updating, each time sampled data signals in said first selective storage buffer are transferred to said second selective storage buffer, each change management list to retain selected time and address information corresponding to said selected time and data information in said time range encompassed by said Qth group.

17. The method of claim 16 additionally including the steps of:

j.) updating, each time sampled data signals in said second selective storage buffer are transferred to said third selective storage buffer, each memory data array to retain a selected time and data information for each memory location changed during the time range encompassed by said Sth group; and k.) updating, each time sampled data signals in said second selective storage buffer are transferred to said third selective storage buffer, each change management list to retain selected time and address information corresponding to said selected time and data information in said time range encompassed by said Sth group.

* * * * *